(12) United States Patent
Agarwal et al.

(10) Patent No.: US 7,679,223 B2
(45) Date of Patent: Mar. 16, 2010

(54) OPTICALLY TRIGGERED WIDE BANDGAP BIPOLAR POWER SWITCHING DEVICES AND CIRCUITS

(75) Inventors: Anant K. Agarwal, Chapel Hill, NC (US); Sumithra Krishnaswami, Morrisville, NC (US); James T. Richmond, Jr., Durham, NC (US)

(73) Assignee: Cree, Inc., Durham, NC (US)

( * ) Notice: Subject to any disclaimer, the term of this patent is extended or adjusted under 35 U.S.C. 154(b) by 916 days.

(21) Appl. No.: 11/412,338

(22) Filed: Apr. 27, 2006

(65) Prior Publication Data

US 2006/0261876 A1 Nov. 23, 2006

Related U.S. Application Data

(60) Provisional application No. 60/680,881, filed on May 13, 2005.

(51) Int. Cl.
*H01H 47/24* (2006.01)
(52) U.S. Cl. ........................................ 307/117; 257/257
(58) Field of Classification Search ................ 307/117, 307/116; 257/257, E29.211
See application file for complete search history.

(56) References Cited

U.S. PATENT DOCUMENTS

| | | | | |
|---|---|---|---|---|
| 3,766,409 | A * | 10/1973 | Shuey | ......................... 327/462 |
| 4,217,618 | A | 8/1980 | Kellenbenz et al. | |
| 4,295,058 | A * | 10/1981 | Lade et al. | ................... 307/117 |
| 4,361,798 | A | 11/1982 | Tolmie | |
| 4,779,126 | A | 10/1988 | Herman | |
| 5,559,340 | A * | 9/1996 | Nakamura et al. | .......... 250/551 |
| 5,663,580 | A | 9/1997 | Harris et al. | |
| 5,747,836 | A | 5/1998 | Mariyama | |
| 6,037,613 | A | 3/2000 | Mariyama | |
| 6,664,560 | B2 | 12/2003 | Emerson et al. | |
| 6,770,911 | B2 | 8/2004 | Agarwal et al. | |
| 7,354,780 | B2 * | 4/2008 | Feng et al. | ..................... 438/20 |

FOREIGN PATENT DOCUMENTS

| | | |
|---|---|---|
| EP | 0720239 | 7/1996 |
| WO | WO 03/023870 | 3/2003 |

OTHER PUBLICATIONS

Colclaser, R. *Electronic Circuit Analysis*, Chapter 13, 1984.
International Search Report for application No. PCT/US2006/018068, mailed Oct. 16, 2006.

* cited by examiner

*Primary Examiner*—Albert W Paladini
(74) *Attorney, Agent, or Firm*—Myers Bigel Sibley & Sajovec

(57) ABSTRACT

An electronic circuit includes a primary wide bandgap bipolar power switching device configured to supply a load current in response to a control signal applied to a control terminal thereof, and a driver device configured to generate the control signal. At least one of the primary switching device or the driver device may include an optically triggered switching device. A discrete wide bandgap semiconductor device includes a primary bipolar device stage configured to switch between a conducting state and a nonconducting state upon application of a control current, and a bipolar driver stage configured to generate the control current and to supply the control current to the primary bipolar device stage. At least one of the primary bipolar device stage and the bipolar driver stage may include an optically triggered wide bandgap switching device.

32 Claims, 6 Drawing Sheets

OPTICALLY TRIGGERED WIDE BANDGAP BIPOLAR POWER SWITCHING DEVICES AND CIRCUITS

RELATED APPLICATION

This application claims the benefit of and priority to U.S. Provisional Patent Application No. 60/680,881 titled "Optically Triggered Wide Bandgap Bipolar Power Switching Devices And Circuits," filed May 13, 2005, the disclosure of which is hereby incorporated herein by reference as if set forth in its entirety.

FIELD OF THE INVENTION

This invention relates to microelectronic devices and circuits, and more particularly to devices and circuits including silicon carbide power switching devices, such as light activated silicon carbide transistors and thyristors.

BACKGROUND

Silicon carbide thyristors are described, for example, in U.S. Pat. No. 5,539,217 (the '217 patent) the disclosure of which is incorporated herein by reference as if set forth fully. The thyristors described in the '217 patent are three terminal devices having a gate and one of an anode or a cathode on a first side of the device and the other of the anode and the cathode on the opposite side of the device. Such silicon carbide thyristors may exhibit improved power handling capabilities over similar silicon thyristors.

Light-activated thyristors having an integrated light source and a silicon carbide active layer have been described in U.S. Pat. No. 5,663,580. Such devices may include four terminal devices including anode and cathode terminals for a light emitting diode which acts to trigger a thyristor having its own anode and cathode terminals.

Light activated silicon thyristors have been utilized in high power applications. For example, optically triggered parallel lateral thyristors are described in U.S. Pat. No. 4,779,126.

While silicon carbide thyristors may provide improved power handling capabilities over comparably sized silicon devices, it may be difficult to form large scale thyristors in silicon carbide. For example, in silicon, a single thyristor may be made on a wafer such that the thyristor is substantially the same size as the wafer. However, manufacturing defect-free silicon carbide wafers may be difficult. Thus, a device which consumes an entire silicon carbide wafer may have defects incorporated into the device which may limit its performance.

Moreover, the large size of silicon thyristors makes the design of an optical driver for such devices a challenge, since it is desirable to apply a uniform light to a large surface area of the device.

SUMMARY

Embodiments of the invention provide optically triggered wide bandgap bipolar power switching circuits and devices. Galvanic isolation between the optical driver mechanism and the bipolar power handling circuit may provide high noise immunity, fast switch turn on, high temperature operation, high voltage operation and the ability to remotely control the switch using fiber optic cable, light pipes or transmission through air or another medium.

Some embodiments of the invention provide an electronic circuit including a wide bandgap bipolar power switching device including a control terminal and configured to supply a load current in response to a control signal applied to the control terminal, and a driver device configured to generate the control signal and supply the control signal to the control terminal of the switching device. At least one of the switching device or the driver device may include an optically triggered device configured to switch between a nonconductive state and a conductive state in response to light being applied thereto.

The electronic circuit may further include a secondary driver device. The control signal generated by the driver device may be supplied to a control terminal of the secondary driver device, and the secondary driver device may be configured to amplify the control signal.

The driver device may include at least a pair of wide bandgap bipolar transistors connected to form a Darlington transistor pair including a base, a collector and an emitter. The emitter of the Darlington transistor pair may be coupled to the control terminal of the switching device.

At least one of the switching device or the driver device may include a silicon carbide bipolar junction transistor. Furthermore, at least one of the switching device or the driver device may include a latching switching device.

The latching switching device may include a thyristor having a control terminal, and the electronic circuit may further include a reverse biased commutating photodiode connected to the control terminal of the thyristor and configured to supply a current sufficient to switch the thyristor to a nonconductive state in response to an optical signal.

An electronic circuit according to further embodiments of the invention includes a driver device including an optically triggered wide bandgap thyristor having an anode and a cathode, and a primary device including a first wide bandgap bipolar transistor having a base, a collector and an emitter. The cathode of the thyristor may be coupled to the base of the first wide bandgap bipolar transistor, and the anode of the thyristor and the collector of the first wide bandgap bipolar transistor are coupled to a source voltage.

The electronic circuit may further include a secondary driver device including a second wide bandgap bipolar transistor having a base, a collector and an emitter. The cathode of the thyristor may be coupled to the base of the second wide bandgap bipolar transistor such that the cathode of the thyristor is coupled to the base of the first wide bandgap bipolar transistor through the second wide bandgap bipolar transistor and such that electrical current passing through the thyristor may be supplied to the base of the second wide bandgap bipolar transistor, and the emitter of the second wide bandgap transistor may be coupled to the base of the first wide bandgap transistor.

The emitter of the first wide bandgap bipolar transistor may be coupled to ground or to a load resistance.

The first wide bandgap bipolar transistor may include an NPN transistor.

The electronic circuit may further include an interstage resistor coupled to the emitter of the second wide bandgap bipolar transistor. The electronic circuit may further include a bias resistor coupled between the collector of the second wide bandgap bipolar transistor and the source voltage.

An electronic circuit according to further embodiments of the invention includes a driver device including an optically triggered wide bandgap thyristor having an anode and a cathode, and a primary device including a first wide bandgap bipolar transistor having a base, a collector and an emitter. The anode of the thyristor may be coupled to the base of the first wide bandgap bipolar transistor, and the cathode of the thyristor and the collector of the first wide bandgap bipolar transistor are coupled to a negative source voltage.

The emitter of the first wide bandgap bipolar transistor may be coupled to ground or to a load resistance.

The electronic circuit may further include a secondary driver device including a second wide bandgap bipolar transistor having a base, a collector and an emitter. The anode of the thyristor may be coupled to the base of the second wide bandgap bipolar transistor such that the anode of the thyristor is coupled to the base of the first wide bandgap bipolar transistor through the second wide bandgap bipolar transistor such that electrical current passing through the thyristor may be drawn from the base of the second silicon carbide bipolar transistor.

The first wide bandgap bipolar transistor may include a PNP transistor.

An electronic circuit according to still further embodiments of the invention includes a primary device including a wide bandgap thyristor having an anode, a cathode and a gate, and a driver device including a first pair of wide bandgap bipolar transistors connected to form a Darlington transistor pair having a base, a collector and an emitter. The gate of the thyristor may be coupled to the emitter of the Darlington transistor pair such that electrical current emitted by the Darlington transistor pair may be provided to the gate of the thyristor to control the conductivity state of the thyristor. At least one of the pair of bipolar transistors forming the Darlington transistor pair may include an optically triggered phototransistor.

Each of the transistors of the Darlington transistor pair may include a PNP transistor, and the cathode of the thyristor and the collector of the Darlington transistor may be coupled to a negative source voltage.

In some embodiments, each of the transistors of the Darlington transistor pair may include an NPN transistor, and the anode of the thyristor and the collector of the Darlington transistor may be coupled to a positive source voltage.

Some embodiments of the invention provide a discrete wide bandgap semiconductor device including a primary bipolar device stage configured to switch between a conducting state and a nonconducting state upon application of a control current, and a bipolar driver stage configured to generate the control current and to supply the control current to the primary bipolar device stage. At least one of the primary bipolar device stage and the bipolar driver stage may include an optically triggered wide bandgap switching device.

At least one of the primary bipolar device stage and the bipolar driver stage may include a latching switching device, such as a thyristor.

The primary bipolar device stage may have a greater current handling capability than the bipolar driver stage.

The bipolar driver stage may include an optically triggered driver device configured to supply a control current to a control region of the primary bipolar device stage. The optically triggered driver device may be formed within a region defined by a side of the control region of the primary bipolar device stage.

The device may further include a secondary driver stage provided between the driver stage and the primary bipolar device stage and configured to supply current to a control region of the primary bipolar device stage.

The optically triggered driver device may be configured to supply current to a control region of the secondary driver device, and the optically triggered driver device may be formed within a periphery of a region defined at least partially by a side of the control region of the secondary driver device. Both the optically triggered driver device and the secondary driver device may be formed within a periphery of a region defined at least partially by a side of the control region of the primary bipolar device stage.

The bipolar driver stage, the secondary driver stage, and the primary bipolar device stage may include bipolar junction transistors fabricated on a silicon carbide substrate that provides a common collector region for the driver stage, the secondary driver stage and primary bipolar device stage.

The silicon carbide substrate may have a first conductivity type, and the device may further include an epitaxial layer on the substrate having a second conductivity type opposite to the first conductivity type. The epitaxial layer may be patterned into isolated regions such that each of the isolated regions provides a control region of one of the driver stage, the secondary driver stage or the primary bipolar device stage.

The device may further include emitter regions on the respective control regions of the driver stage, the secondary driver stage and the primary bipolar device stage, the emitter regions having the first conductivity type. The control regions of the driver stage, the secondary driver stage and the primary bipolar device stage may be isolated by mesa and/or implant isolation.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
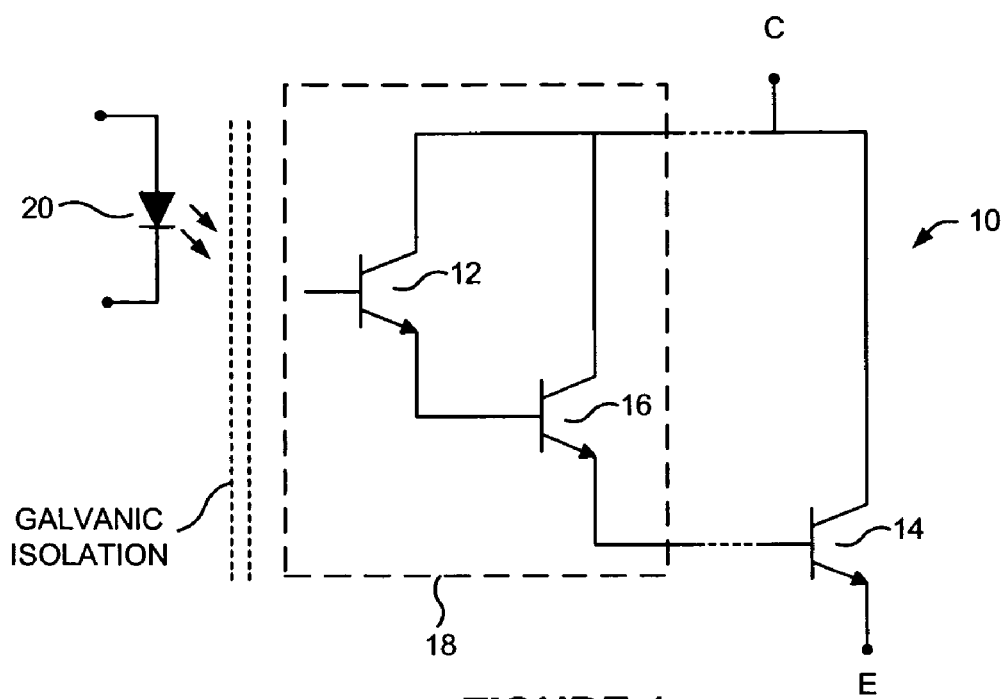
FIGS. 1-7 are schematic circuit diagrams illustrating devices and/or circuits according to embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN.

Referring now to the drawings, FIGS. 1 through 7 and 10 are schematic circuit diagrams illustrating various embodiments of light-activated power switching circuits according to the present invention. Transistors, including thyristors according to embodiments of the present invention may be formed of silicon carbide having a polytype of 3C, 2H, 4H, 6H, and 15R, or from any of the various Group III-nitride materials useful for fabricating electronic devices. In the illustrated embodiments, the n+ and n− regions, as well as the p+ and p− regions, are designated "+" and "−" to symbolize different doping concentration levels respectively of the same conductivity type material in a manner well understood to those of ordinary skill in this art. As used herein, the "+" and "−" designations do not necessarily imply that a material is degenerate on one hand or semi-insulating on the other. The p-type silicon carbide may be doped, for example, with aluminum or boron and the n-type silicon carbide may be doped, for example, with nitrogen or phosphorous. P-type nitrides may be doped, for example, with magnesium, while n-type nitrides may be doped, for example, with silicon.

FIG. 1 is a schematic diagram of a multistage, optically triggered power switching circuit 10 according to embodiments of the invention. The circuit 10 includes a driver transistor 12 and a primary transistor 14. In addition, one or more optional secondary driver transistors 16 may be provided in the circuit. In the embodiments illustrated in FIG. 1, driver transistor 12 is an NPN-type phototransistor having a collector, an emitter, and an exposed base region configured to permit penetration of UV light from an external or integral UV light source 20 which is galvanically isolated from the driver transistor 12. The emitter of the driver transistor 12 is coupled to the base of the optional secondary driver transistor 16 such that driver transistor 12 and the secondary driver transistor 16 form a Darlington transistor pair 18. Darlington transistor operation is well known in the art and is described for example in Chapter 13 of R. Colclaser, Electronic Circuit Analysis (Wiley, 1984).

Emitter current flowing from the driver transistor 12 is amplified by the optional secondary driver transistor 16. Emitter current flowing from the optional secondary driver transistor 16 is coupled to the base of the primary transistor 14. Base current applied to the primary transistor 14 causes the primary transistor 14 to turn on, allowing current to flow through the primary transistor between the collector and emitter terminals thereof.

As indicated in FIG. 1, additional optional secondary driver transistors 16 may by included for further current amplification of the base drive current. It will be understood that in embodiments that do not include optional secondary driver transistors 16, the emitter current flowing from the driver transistor 12 may be applied directly to the base contact of the primary transistor 14.

In the embodiments illustrated in FIG. 1, the collectors of the driver transistor 12, the primary transistor 14 and the optional secondary driver transistor 16 may be commonly coupled to a source voltage (not shown), while the emitter of the primary transistor 14 may be coupled to ground or a load resistance (not shown).

A UV source 20 provides light with sufficient energy to cause the driver transistor 12 to conduct. In some embodiments, the active semiconductor layers of the driver transistor 12 include a wide bandgap material such as silicon carbide (SiC), gallium nitride (GaN) or another Group III-nitride material. In order to induce the formation of electron-hole pairs in a wide bandgap material, light, such as ultraviolet (UV) light, with energy in excess of the material bandgap may be directed into the material. For silicon carbide, light having an energy of about 3.25 eV or greater (i.e. a wavelength of about 380 nm or less) may be used. For gallium nitride, which has a smaller bandgap than SiC, light of a correspondingly larger wavelength may be used. UV light may be generated by a UV light emitting diode or laser diode or other suitable light source. UV light emitting diodes are described, for example, in U.S. Pat. No. 6,664,560 entitled "Ultraviolet Light Emitting Diode," which is assigned to the assignee of the present application. U.S. Pat. No. 6,664,560 is hereby incorporated herein by reference as if set forth in its entirety.

UV light source 20 may be formed integral to the driver transistor 12 as described in U.S. Pat. No. 5,663,580, packaged together with the driver transistor 12 as part of a hybrid, or provided as a separate element.

When the driver transistor 12 is in the "off" state (i.e. no current is flowing between the collector and emitter of the device), no base current is supplied to the primary transistor 14, and the primary transistor stays in the "off" state, blocking the collector voltage.

When sufficiently energetic light is applied to the driver transistor 12, electron-hole pairs are generated in the depletion region existing at the collector/base junction. If sufficient carriers are generated in the collector-base junction, the energy barrier at the junction will decrease, causing the junction to become forward biased, which turns the device on and permits a flow of electrical current between the collector and emitter of the device. Once the driver transistor 12 has been turned on in this manner, base current will be supplied to the primary transistor 14, turning that device on and permitting output current to flow.

Figure 2:
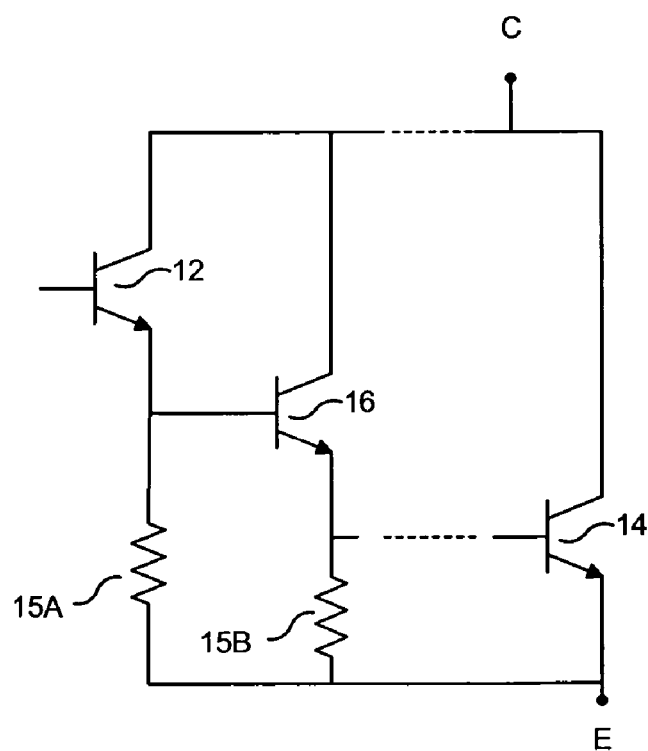
Figure 3:
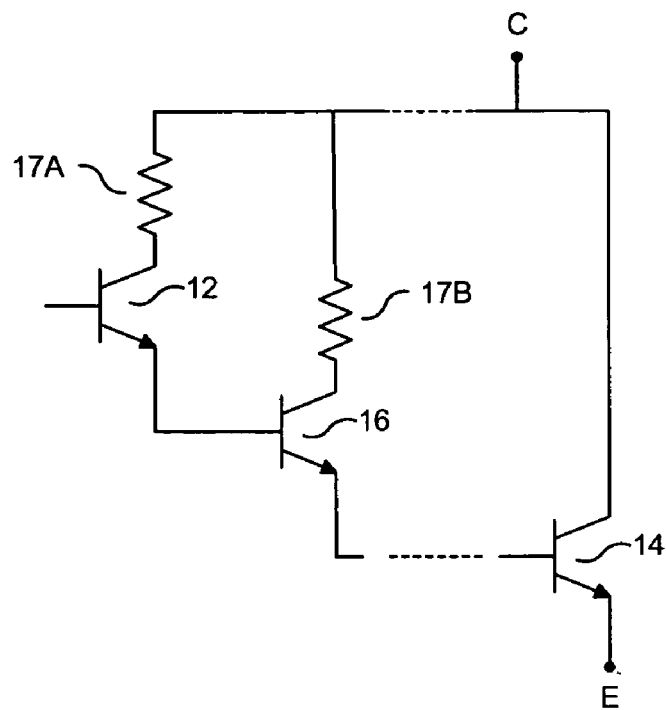

FIG. 2 illustrates embodiments of the invention in which the driver transistor 12 and the optional amplification transistor 16 include resistive loads 15A, 15B coupled respectively to the emitters thereof. Such interstage resistive loading may reduce the effect of high gain loading of Miller capacitance and/or reduce turn-off time. FIG. 3 illustrates a resistor biased BJT configuration in which the driver transistor 12 and the optional secondary driver transistor 16 are biased by resistors 17A, 17B to reduce the base junction offset in the output characteristics. Selection of appropriate resistance values for the interstage resistors 15A, 15B and the bias resistors 17A, 17B is known to those skilled in the art.

One aspect of the embodiments illustrated in FIG. 1 is that the driver transistor 12 may only remain in the "on" state as long as a sufficient level of UV light shines on the device, creating the electron-hole pairs used to maintain conductivity through the device. Once the light source is switched off, the driver transistor 12 will return to the off state, which will cause the primary transistor 14 to switch off and once again block the applied collector voltage.

In some applications, it may be desirable for the primary transistor 14 to remain in the "on" state even after the light source is switched off. In that case, it may be desirable for at least one of the driver transistor 12, a secondary driver transistor 16 and/or the primary transistor 14 to include a latching device such as a thyristor.

As is known to those skilled in the art, a thyristor is a four-layer latching switching device having an anode and a cathode for current flow and a gate for switching the device from a blocking state to a conducting state, and vice versa. A control signal applied to the gate causes the device to "latch" into a conductive state in which current can flow freely between the anode and cathode of the device. The device remains in the conductive state even after the control signal is removed. A second control signal, opposite in polarity to the first control signal, switches the device back into the "off" or blocking state. While certain wide bandgap thyristor designs are discussed in more detail below, the design of optically triggered wide bandgap thyristors is generally known in the art. For example, U.S. Pat. No. 6,770,911 entitled "Large Area Silicon Carbide Devices," assigned to the assignee of the present application, describes the design and manufacture of optically triggered silicon carbide thyristors. U.S. Pat. No. 6,770,911 is hereby incorporated herein by reference as if set forth in its entirety.

Figure 4:
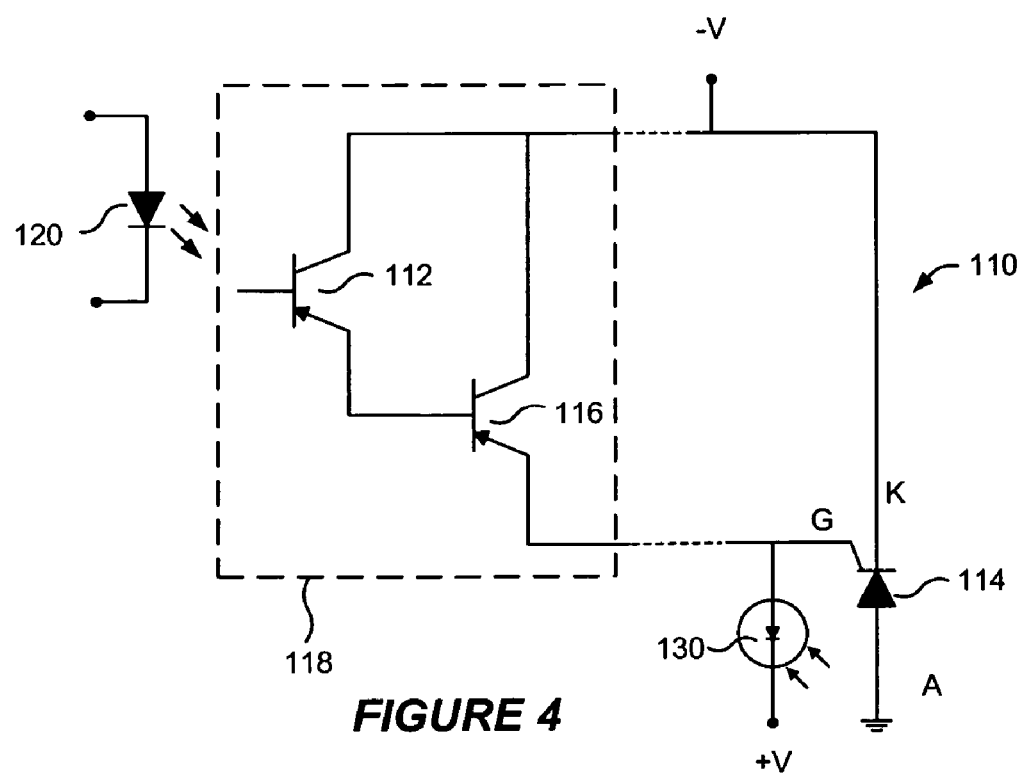

FIG. 4 illustrates embodiments of the invention in which the primary switching device includes a wide bandgap thyristor. As illustrated in FIG. 4, an electronic circuit 110 includes a wide bandgap thyristor 114 having an anode, a cathode and a gate. A wide bandgap bipolar PNP phototransistor 112 functions as the driver transistor, while an optional PNP amplification transistor 116 is coupled to the driver transistor 112 to form a Darlington transistor 118 having a base, a collector and an emitter. While a Darlington transistor pair 118 is illustrated in FIG. 4, it will be understood in light of the description of embodiments of FIGS. 2 and 3 above that the driver transistor 112 and/or the optional secondary driver transistor 116 may include resistive loading/and or biasing networks. Thus, the transistors 112, 116 may not be connected as a Darlington pair in a strict sense.

The emitter of the Darlington transistor 118 is coupled to the gate G of the thyristor 114 such that electrical current emitted by the Darlington transistor is provided to the gate G of the thyristor 114 to control the conductivity state of the thyristor 114. The cathode K of the thyristor 114 and the collector of the Darlington transistor are coupled to a negative source voltage −V, and the anode A of the thyristor 114 is coupled to ground or to a load resistance (not shown). The driver transistor 112 may be an optically triggered phototransistor. Optionally, the thyristor 114 could be optically triggered, in which case the gate of transistor 112 would also be coupled to the source voltage −V.

In the embodiments of FIG. 4, UV light applied to the driver phototransistor 112 causes the thyristor 114 to switch to the "on" or conducting state. The thyristor 114 remains in the "on" state until an appropriate signal is applied to the terminals of the thyristor 114, for example, by means of a signal from a commutating photodiode 130. Circuits fabricated according to such embodiments may be controlled entirely by optical means. For example, they may be switched to the "on" position by means of a sufficiently energetic light pulse applied to the gate of the optically triggered transistor 112 and switched to the "off" state by means of a sufficiently energetic light pulse applied to the reverse biased commutating photodiode 130, which interrupts the self-sustaining carrier injection process of the thyristor 114 thereby causing the thyristor 114 to cease to conduct current.

Figure 5:
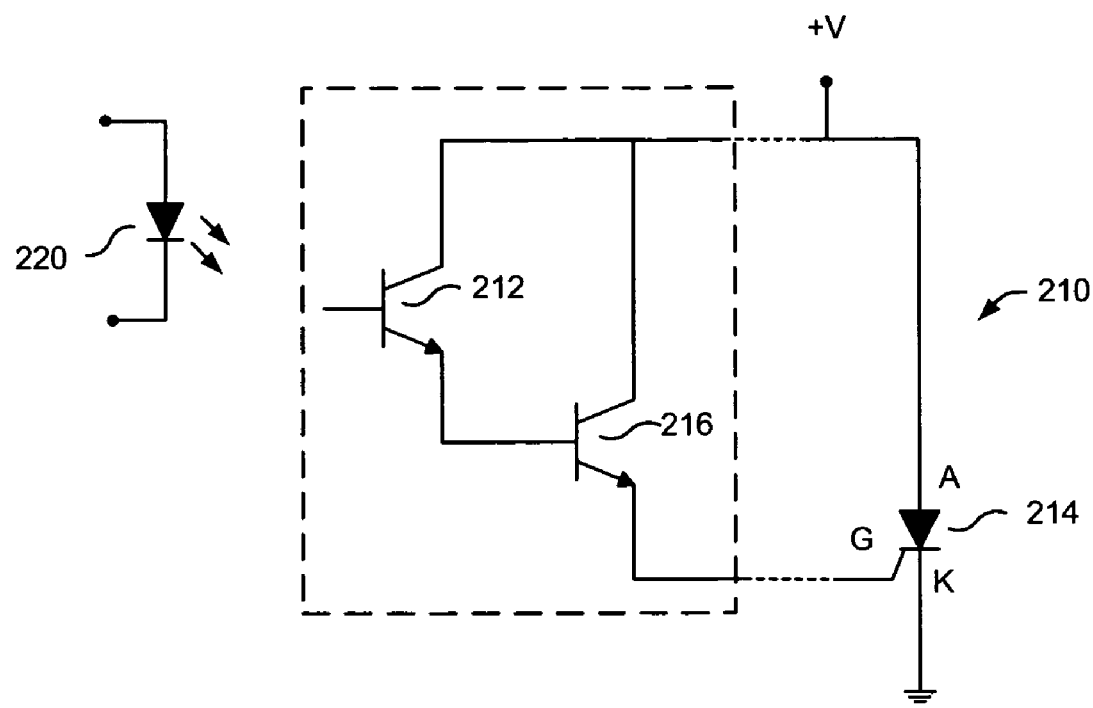

FIG. 5 illustrates an electronic circuit 210 similar to the circuit 110 described in connection with FIG. 4, except that the circuit 210 illustrated in FIG. 5 includes an NPN driver transistor 212 and an optional NPN secondary driver transistor 216. In this embodiment, the collectors of the driver transistor 212 and the optional NPN amplification transistor 216, as well as the anode A of the thyristor 214, are coupled to a positive voltage source +V.

Figure 6:
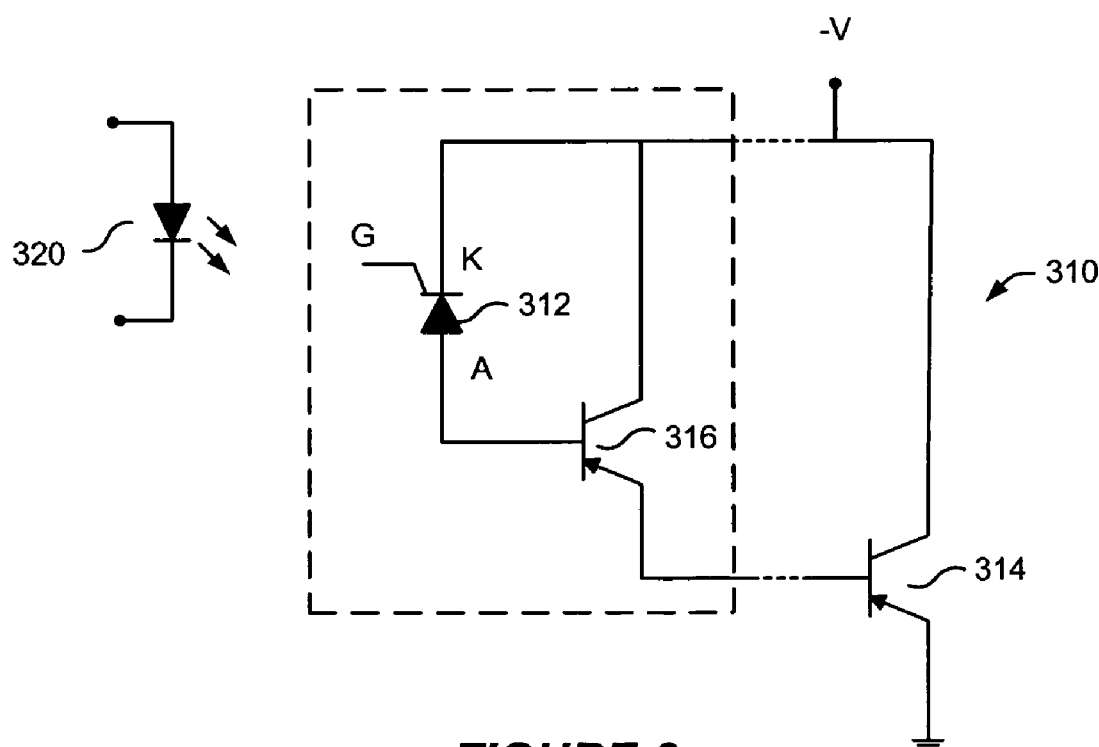

FIG. 6 illustrates an electronic circuit 310 according to further embodiments of the invention. The electronic circuit 310 includes an optically triggered wide bandgap thyristor 312 which functions as a driver device. The thyristor 312 has an anode A and a cathode K, with the cathode K being connected to a negative supply voltage −V and the anode A coupled to the gate of an optional wide bandgap PNP bipolar secondary driver transistor 316 such that electrical current passing through the thyristor 312 is drawn from the base of the amplification transistor 316. The emitter of the secondary driver transistor 316 is coupled to the base of a primary transistor 314 and provides a control signal which controls the on/off state of the primary transistor 314. The cathode of the thyristor 312, the collector of the secondary driver transistor 316 and the collector of the primary transistor are coupled to a negative source voltage −V, and the emitter of the primary transistor is coupled to ground or to a load resistance (not shown).

Figure 7:
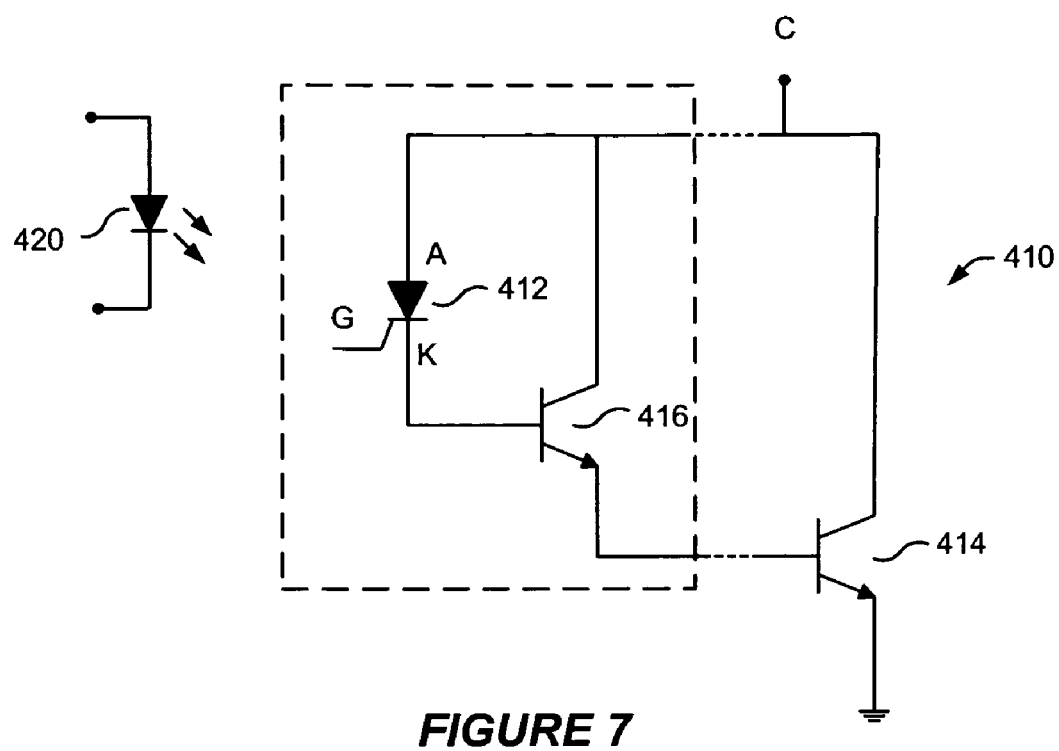

Likewise, FIG. 7 illustrates an electronic circuit 410 that is similar to the electronic circuit 310 of FIG. 6 except that the secondary driver transistor 416 and the primary transistor 414 include NPN transistors. In the embodiments illustrated in FIG. 7, the anode A of the thyristor 412 and the collectors of the secondary driver transistor 416 and the primary transistor 414 are coupled to a positive voltage supply +V, while the emitter of the primary transistor 414 is coupled to ground or a load resistance.

Figure 8:
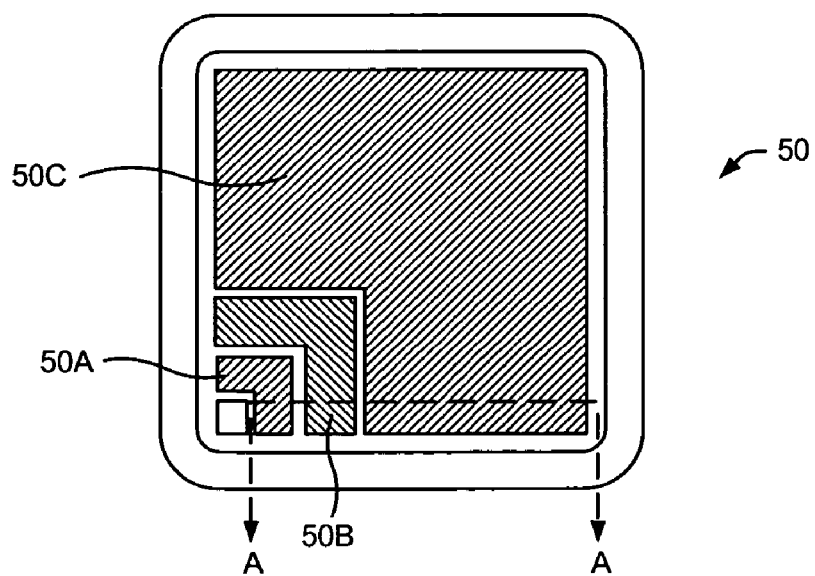
FIG. 8 is a schematic top view of an electronic device according to some embodiments of the invention.

Further embodiments of the invention are illustrated in FIG. 8, which is a plan view of a fabricated discrete wide bandgap semiconductor device 50 having a plurality of interconnected transistor stages, at least one stage of which is an optically triggered transistor device. In some embodiments, at least one stage of the discrete semiconductor device 50 is a latching device such as a thyristor.

In some embodiments, at least one of the transistor stages has a greater current handling capability compared to another of the transistor stages. For example, the primary transistor may have a higher current conduction capability than the driver transistor, since the majority of current flowing through the device in the "on" state passes through the primary transistor.

As illustrated in FIG. 8, the discrete semiconductor device 50 includes as a driver device a first optically triggered transistor 50A configured to supply a current to a control region of a second transistor device 50B, which is an optional secondary driver device. The control region of the first optically triggered transistor 50A is formed within a region defined by a side of the control region of the second transistor device 50B. In some embodiments, the second transistor device 50B is configured to supply current to a control region of a primary transistor device 50C. Both the driver and secondary driver devices 50A, 50B are formed within a region defined by a side of the control region of the primary device 50C. Additional or further nesting or arrangement of devices may be accomplished.

Figure 9:
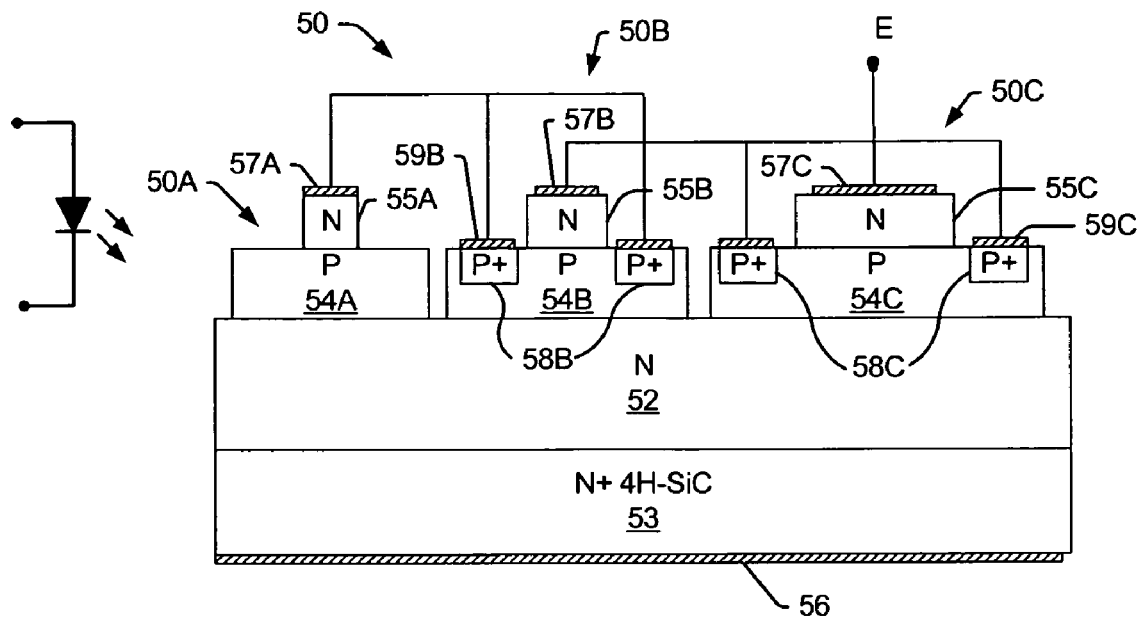
FIG. 9 is a schematic cross sectional illustration of the electronic device of FIG. 8.

FIG. 9 is a cross-sectional schematic diagram of the device 50 taken along line A-A in FIG. 8, showing a physical relationship between the transistor devices 50A, 50B and 50C.

In some embodiments, the driver device 50A, the secondary driver device 50B and the primary device 50C include bipolar junction transistors fabricated on a single n-type 4H silicon carbide substrate 52. The design and fabrication of bipolar junction transistors in silicon carbide is known in the art. SiC bipolar transistors are described for example in U.S. Pat. No. 4,945,394 the disclosure of which is incorporated herein by reference as if set forth in its entirety.

As illustrated in FIG. 9, a device according to some embodiments includes an n-type substrate 52 which acts as a common collector region for the driver device 50A, the secondary driver device 50B and the primary device 50C. A highly doped n+ region 53 is formed on one side of the substrate 52 as a collector contact region. A p-type epitaxial layer 54 formed on the substrate 52 is patterned into isolated regions 54A, 54B, 54C such that each of the isolated regions forms the base or control region of one of the driver device 50A, the secondary driver device 50B or the primary device 50C. The base region 54A of the driver device 50A is formed within a region defined at least partially by a side of the base region 54B of the secondary driver device 50B. Likewise, the base region 54B of the secondary driver device 50B is formed within a region defined at least partially by a side of the base region 54C of the primary device 50C. N-type epitaxial emitter regions 55A, 55B, 55C are formed on the p-type regions 54A, 54B, 54C, respectively. Isolation of the p-type base regions 54A-54C may be accomplished by mesa etching as illustrated and/or implant isolation. Ohmic contacts 57A, 57B, 57C are formed on the emitter regions of the devices. A common collector ohmic contact 56 is provided on the collector contact region 53. The base regions 54B, 54C may optionally include p+ base contact regions 58B, 58C to facilitate formation of ohmic contacts 59B, 59C thereto. The devices 50A, 50B, 50C may be interconnected as illustrated in FIG. 9 to form an integrated power switching device 50. Thus, for example, the emitter contact 57A of the driver transistor 50A is coupled to the gate contacts 59B of the secondary driver transistor 50B. Similarly, the emitter contact 57B of the secondary driver transistor 50B is coupled to the gate contacts 59B of the primary transistor device 50C.

Figure 10:
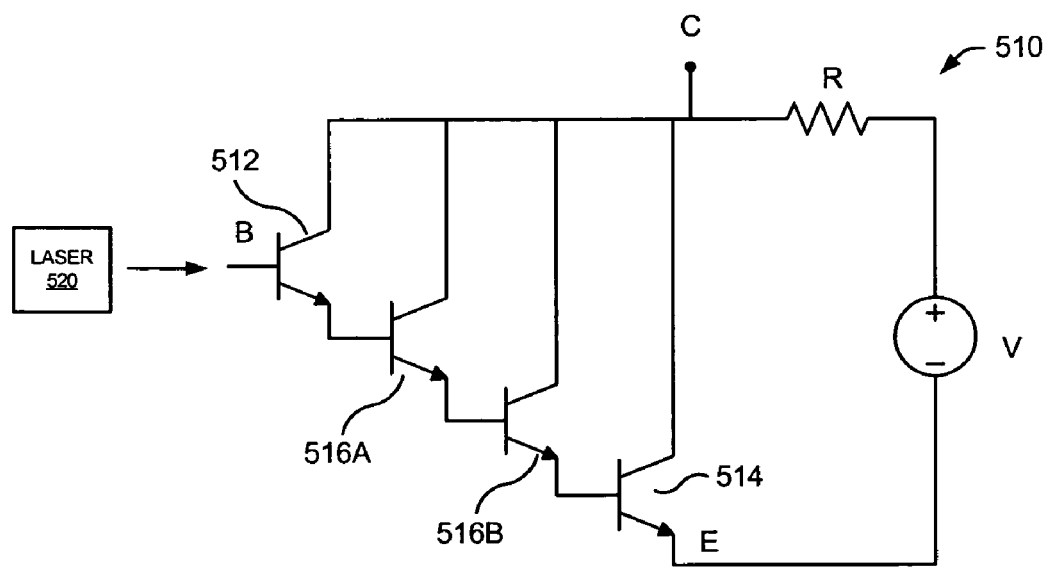
FIG. 10 is a schematic circuit diagram illustrating devices and/or circuits according to embodiments of the invention.

FIG. 10 shows a test setup used to evaluate the switching performance of a 4 stage Darlington BJT circuit 510 configured in accordance with embodiments of the invention and fabricated using discrete devices. The circuit 510 includes an optically-triggered phototransistor 512 which acts as a driver transistor. A pair of secondary driver transistors 516A and 516B connected in Darlington configuration amplify the current output from the driver transistor 512 and supply the amplified current to the base of a primary transistor 514. A 40-ohm load resistor R and a 40V voltage supply V complete the test circuit. The transistors 512, 516A, 516B and 514 were fabricated in silicon carbide. A pulsed 266 nm laser was used as the UV source 520.

Figure 11:
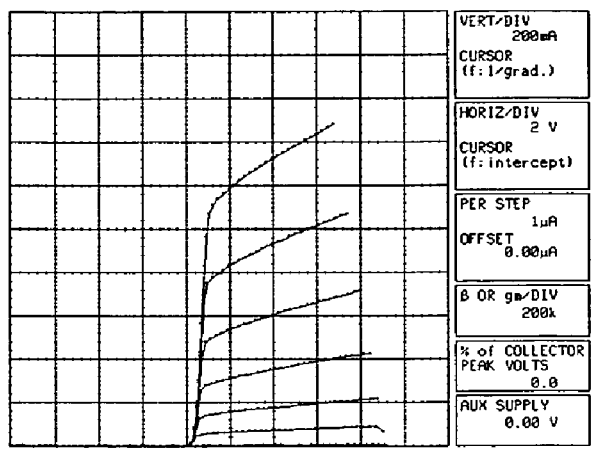
FIG. 11 is a graph of the DC characteristics of a circuit configured according to some embodiments of the invention.

FIG. 11 is a graph of the DC characteristics of the 4 stage Darlington BJT circuit of FIG. 10. The device exhibited a peak DC current gain of over 400,000.

Figure 12:
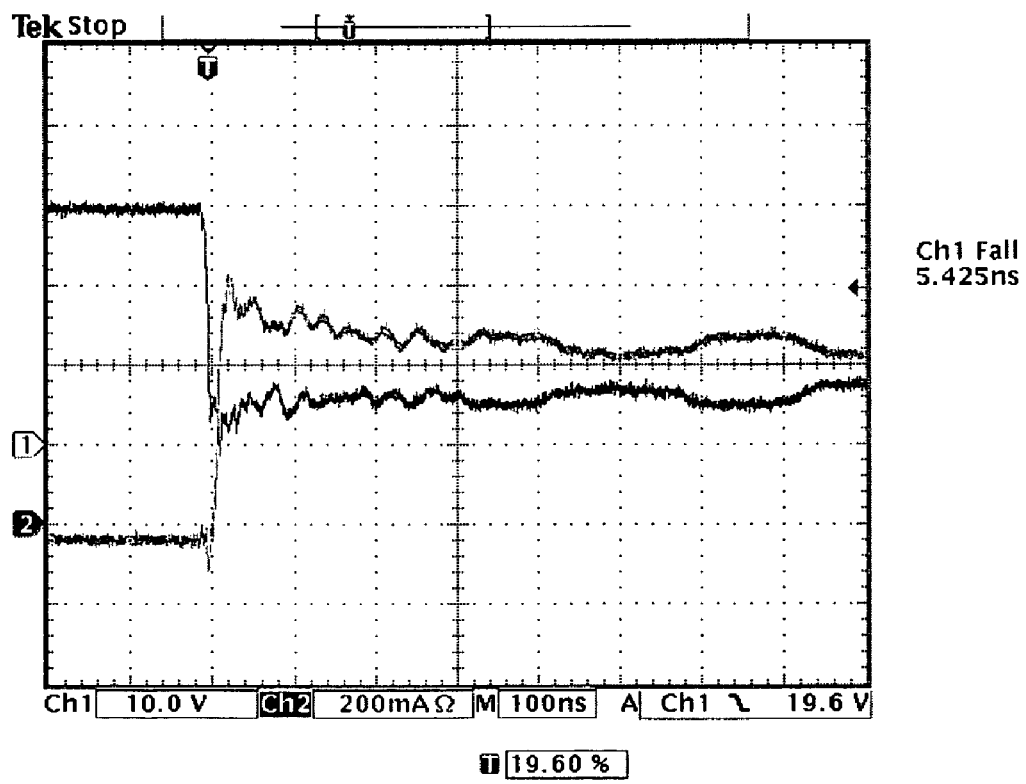
FIG. 12 is a graph of the turn on switching characteristics of a circuit configured according to some embodiments of the invention.

FIG. 12 is a graph of the turn on switching characteristics of the 4 stage Darlington BJT circuit of FIG. 10. A turn on time of less than 6 ns was measured.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An electronic circuit, comprising:
   a wide bandgap bipolar power switching device including a control terminal and configured to supply a load current in response to a control signal applied to the control terminal; and
   a driver device configured to generate the control signal and supply the control signal to the control terminal of the switching device;
   wherein the driver device comprises an optically triggered device configured to switch between a nonconductive state and a conductive state in response to light being applied thereto.

2. The electronic circuit of claim 1, further comprising a secondary driver device, wherein the control signal generated by the driver device is supplied to a control terminal of the secondary driver device, and wherein the secondary driver device is configured to amplify the control signal.

3. The electronic circuit of claim 1, wherein the driver device includes at least a pair of wide bandgap bipolar transistors connected to form a Darlington transistor pair including a base, a collector and an emitter, and wherein the emitter of the Darlington transistor pair is coupled to the control terminal of the switching device.

4. The electronic circuit of claim 1, wherein at least one of the switching device or the driver device comprises a silicon carbide bipolar junction transistor.

5. The electronic circuit of claim 1, wherein at least one of the switching device or the driver device comprises a latching switching device.

6. The electronic circuit of claim 5, wherein the latching switching device comprises a thyristor having a control terminal, the electronic circuit further comprising a reverse biased commutating photodiode connected to the control terminal of the thyristor and configured to supply a current sufficient to switch the thyristor to a nonconductive state in response to an optical signal.

7. An apparatus, comprising:
 a driver device including an optically triggered wide bandgap thyristor having an anode and a cathode; and
 a primary device including a first wide bandgap bipolar transistor having a base, a collector and an emitter;
 wherein the cathode of the thyristor is coupled to the base of the first wide bandgap bipolar transistor; and
 wherein the anode of the thyristor and the collector of the first wide bandgap bipolar transistor are coupled to a source voltage.

8. The electronic circuit apparatus of claim 7, further comprising:
 a secondary driver device including a second wide bandgap bipolar transistor having a base, a collector and an emitter, wherein the cathode of the thyristor is coupled to the base of the second wide bandgap bipolar transistor such that the cathode of the thyristor is coupled to the base of the first wide bandgap bipolar transistor through the second wide bandgap bipolar transistor and such that electrical current passing through the thyristor is supplied to the base of the second wide bandgap bipolar transistor; and wherein the emitter of the second wide bandgap transistor is coupled to the base of the first wide bandgap transistor.

9. The electronic circuit apparatus of claim 7, wherein the emitter of the first wide bandgap bipolar transistor is coupled to ground or to a load resistance.

10. The apparatus of claim 7, wherein the first wide bandgap bipolar transistor comprises an NPN transistor.

11. The apparatus of claim 8, further comprising an interstage resistor coupled to the emitter of the second wide bandgap bipolar transistor.

12. The apparatus of claim 8, further comprising a bias resistor coupled between the collector of the second wide bandgap bipolar transistor and the source voltage.

13. An apparatus, comprising:
 a driver device including an optically triggered wide bandgap thyristor having an anode and a cathode; and
 a primary device including a first wide bandgap bipolar transistor having a base, a collector and an emitter;
 wherein the anode of the thyristor is coupled to the base of the first wide bandgap transistor, and wherein the cathode of the thyristor and the collector of the first wide bandgap bipolar transistor are coupled to a negative source voltage.

14. The apparatus of claim 13, wherein the emitter of the first wide bandgap bipolar transistor is coupled to ground or to a load resistance.

15. The electronic circuit apparatus of claim 13, further comprising:
 a secondary driver device including a second wide bandgap bipolar transistor having a base, a collector and an emitter, wherein the anode of the thyristor is coupled to the base of the second wide bandgap bipolar transistor such that the anode of the thyristor is coupled to the base of the first wide bandgap bipolar transistor through the second wide bandgap bipolar transistor and such that electrical current passing through the thyristor is drawn from the base of the second silicon carbide bipolar transistor.

16. The apparatus of claim 13, wherein the first wide bandgap bipolar transistor comprises a PNP transistor.

17. An electronic circuit, comprising:
 a primary device including a wide bandgap thyristor having an anode, a cathode and a gate; and
 a driver device including a first pair of wide bandgap bipolar transistors connected to form a Darlington transistor pair having a base, a collector and an emitter;
 wherein the gate of the thyristor is coupled to the emitter of the Darlington transistor pair such that electrical current emitted by the Darlington transistor pair is provided to the gate of the thyristor to control the conductivity state of the thyristor; and
 wherein at least one of the pair of bipolar transistors forming the Darlington transistor pair comprises an optically triggered phototransistor.

18. The electronic circuit of claim 17, wherein each of the transistors of the Darlington transistor pair comprises a PNP transistor, and wherein the cathode of the thyristor and the collector of the Darlington transistor are coupled to a negative source voltage.

19. The electronic circuit of claim 17, wherein each of the transistors of the Darlington transistor pair comprises an NPN transistor, and wherein the anode of the thyristor and the collector of the Darlington transistor are coupled to a positive source voltage.

20. A discrete wide bandgap semiconductor device, comprising:
 a primary bipolar device stage configured to switch between a conducting state and a nonconducting state upon application of a control current; and
 a bipolar driver stage configured to generate the control current and to supply the control current to the primary bipolar device stage;
 wherein the primary bipolar device stage and the bipolar driver stage comprises an optically triggered wide bandgap switching device.

21. The device of claim 20, wherein at least one of the primary bipolar device stage and the bipolar driver stage comprises a latching switching device.

22. The device of claim 21, wherein the latching switching device comprises a thyristor.

23. The device of claim 20, wherein the primary bipolar device stage has a greater current handling capability than the bipolar driver stage.

24. The device of claim 20, wherein the bipolar driver stage comprises an optically triggered driver device configured to supply a control current to a control region of the primary bipolar device stage.

25. The device of claim 24, wherein the optically triggered driver device is formed within a region defined by a side of the control region of the primary bipolar device stage.

26. The device of claim 20, further comprising a secondary driver stage provided between the driver stage and the primary bipolar device stage and configured to supply current to a control region of the primary bipolar device stage.

27. The device of claim 26, wherein the optically triggered driver device is configured to supply current to a control region of the secondary driver device, and wherein the optically triggered driver device is formed within a periphery of a region defined at least partially by a side of the control region of the secondary driver device.

28. The device of claim 27, wherein both the optically triggered driver device and the secondary driver device are formed within a periphery of a region defined at least partially by a side of the control region of the primary bipolar device stage.

29. The device of claim 26, wherein the bipolar driver stage, the secondary driver stage, and the primary bipolar device stage comprise bipolar junction transistors fabricated on a silicon carbide substrate that provides a common collector region for the driver stage, the secondary driver stage and primary bipolar device stage.

30. The device of claim 29, wherein the silicon carbide substrate has a first conductivity type, the device further comprising an epitaxial layer on the substrate having a second conductivity type opposite to the first conductivity type, wherein the epitaxial layer is patterned into isolated regions such that each of the isolated regions provides a control region of one of the driver stage, the secondary driver stage or the primary bipolar device stage.

31. The device of claim 30, further comprising emitter regions on the respective control regions of the driver stage, the secondary driver stage and the primary bipolar device stage, the emitter regions having the first conductivity type.

32. The device of claim 30, wherein the control regions of the driver stage, the secondary driver stage and the primary bipolar device stage are isolated by mesa and/or implant isolation.

* * * * *

UNITED STATES PATENT AND TRADEMARK OFFICE
CERTIFICATE OF CORRECTION

PATENT NO. : 7,679,223 B2
APPLICATION NO. : 11/412338
DATED : March 16, 2010
INVENTOR(S) : Agarwal et al.

It is certified that error appears in the above-identified patent and that said Letters Patent is hereby corrected as shown below:

Column 11, Claim 8, Line 18: Please correct by deleting "electronic circuit"
so that it reads --The apparatus--
Claim 9, Line 32: Please correct by deleting "electronic circuit"
so that it reads --The apparatus--
Claim 15, Line 56: Please correct by deleting "electronic circuit"
so that it reads --The apparatus--

Column 12, Claim 20, Line 35: Please correct by deleting "the primary bipolar
device stage and" so that it reads
--wherein the bipolar--

Signed and Sealed this

Twenty-seventh Day of July, 2010

David J. Kappos
*Director of the United States Patent and Trademark Office*